United States Patent
Hsiung et al.

(10) Patent No.: US 9,922,716 B2
(45) Date of Patent: Mar. 20, 2018

(54) ARCHITECTURE FOR CMOS UNDER ARRAY

(71) Applicant: SANDISK TECHNOLOGIES LLC, Plano, TX (US)

(72) Inventors: Chia-Lin Hsiung, Mountain View, CA (US); Yanbin An, Santa Clara, CA (US); Alexander Chu, San Francisco, CA (US); Fumiaki Toyama, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/439,858

(22) Filed: Feb. 22, 2017

(65) Prior Publication Data

US 2017/0309339 A1    Oct. 26, 2017

Related U.S. Application Data

(60) Provisional application No. 62/326,720, filed on Apr. 23, 2016, provisional application No. 62/356,385, filed on Jun. 29, 2016.

(51) Int. Cl.
*G11C 16/00* (2006.01)
*G11C 16/26* (2006.01)
(Continued)

(52) U.S. Cl.
CPC .......... *G11C 16/26* (2013.01); *G11C 16/0466* (2013.01); *G11C 16/0483* (2013.01);
(Continued)

(58) Field of Classification Search
CPC . G11C 16/26; G11C 16/0466; G11C 16/0483; G11C 16/08; G11C 16/10; G11C 16/3459
(Continued)

(56) References Cited

U.S. PATENT DOCUMENTS

| | | | |
|---|---|---|---|
| 2012/0182779 A1* | 7/2012 | Fukuda | ............... G11C 5/063 365/63 |
| 2015/0371925 A1 | 12/2015 | Thimmegowda | |

OTHER PUBLICATIONS

Dick James, "Intel/Micron Detail Their 3D-NAND at IEDM," Chipworks Blog posted on Dec. 14, 2015, available at: http://www.chipworks.com/about-chipworks/overview/blog/intelmicron-detail-their-3d-nand-iedm.

(Continued)

*Primary Examiner* — Tan T. Nguyen
(74) *Attorney, Agent, or Firm* — Vierra Magen Marcus LLP

(57) ABSTRACT

Systems and methods for reducing the area and improving the performance of a non-volatile memory array are described. The non-volatile memory array may comprise a 3D NAND memory array that includes vertical NAND strings that are arranged orthogonal to a substrate. A vertical NAND string may include floating gate memory cell transistors or charge trap memory cell transistors. Sensing circuitry for sensing the programmed data states of memory cell transistors within the vertical NAND strings may be positioned underneath the 3D NAND memory array and connections from bit lines positioned above the 3D NAND memory array may be made using vertical connections extending though the 3D NAND memory array or through memory breaks within the 3D NAND memory array.

23 Claims, 18 Drawing Sheets

(51) Int. Cl.
  *G11C 16/04*  (2006.01)
  *G11C 16/08*  (2006.01)
  *G11C 16/10*  (2006.01)
  *G11C 16/34*  (2006.01)

(52) U.S. Cl.
  CPC .............. *G11C 16/08* (2013.01); *G11C 16/10* (2013.01); *G11C 16/3459* (2013.01)

(58) Field of Classification Search
  USPC .............. 365/51, 63, 185.11, 185.17, 230.03
  See application file for complete search history.

(56) References Cited

OTHER PUBLICATIONS

Johnson, et al., "512-MB PROM With a Three-Dimensional Array of Diode/Antifuse Memory Cells," IEEE Journal of Solid-State Circuits vol. 38, Issue 11, pp. 1920-1928, Oct. 2003, DOI: 10.1109/JSSC.2003.818147.

\* cited by examiner

FIG. 3A

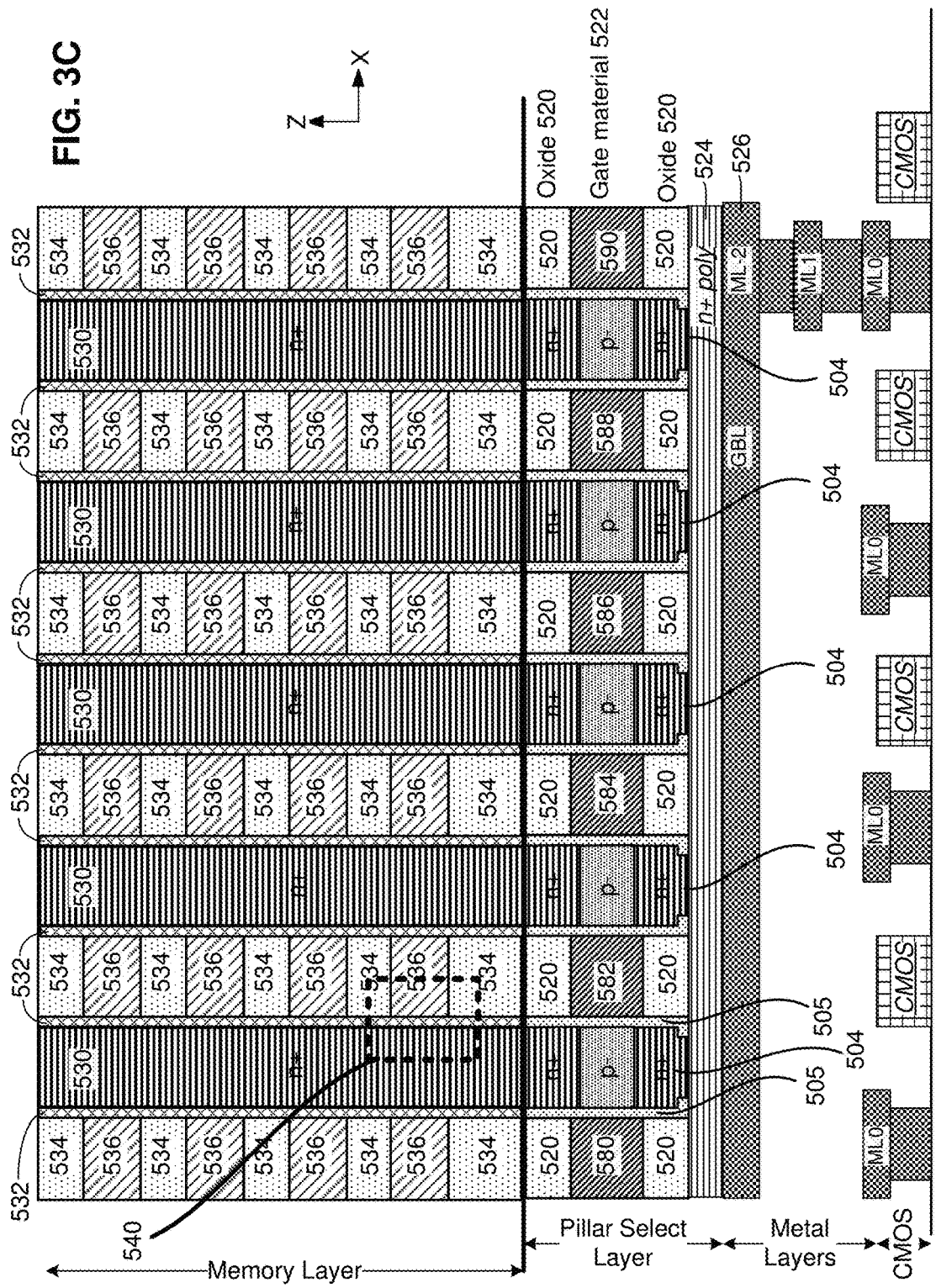

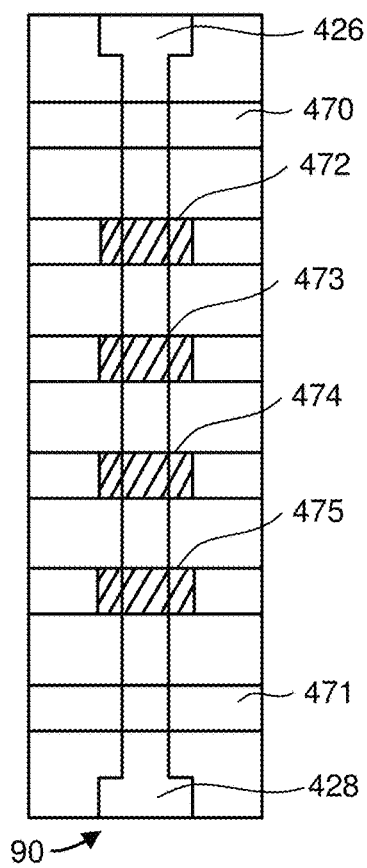
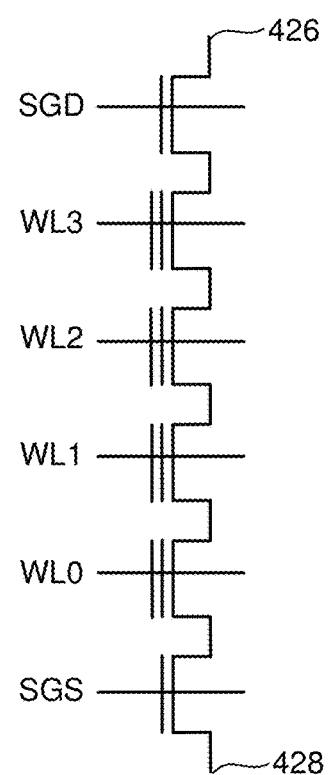
FIG. 4A  FIG. 4B

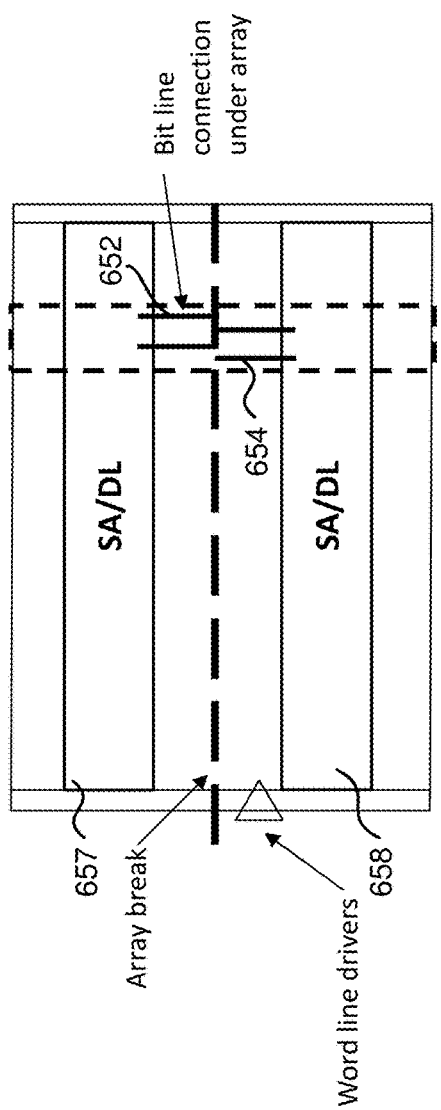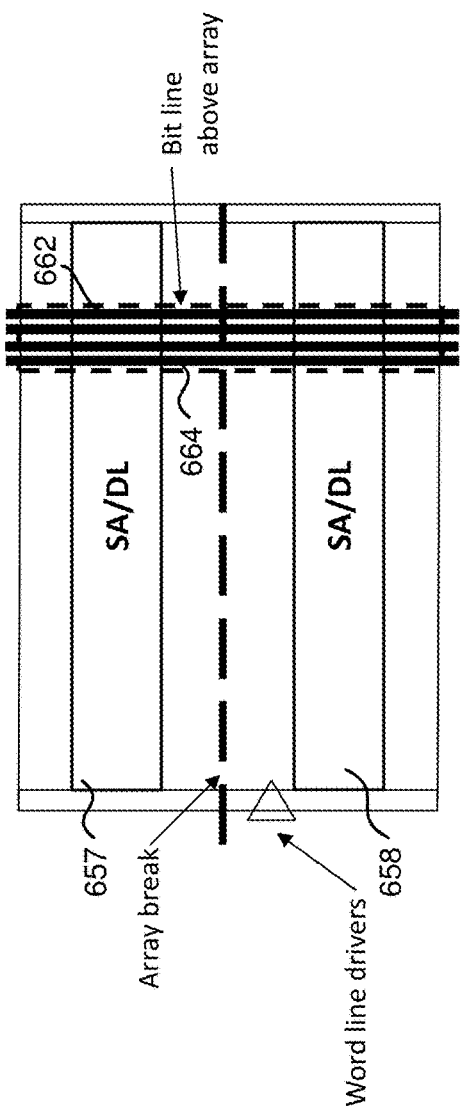

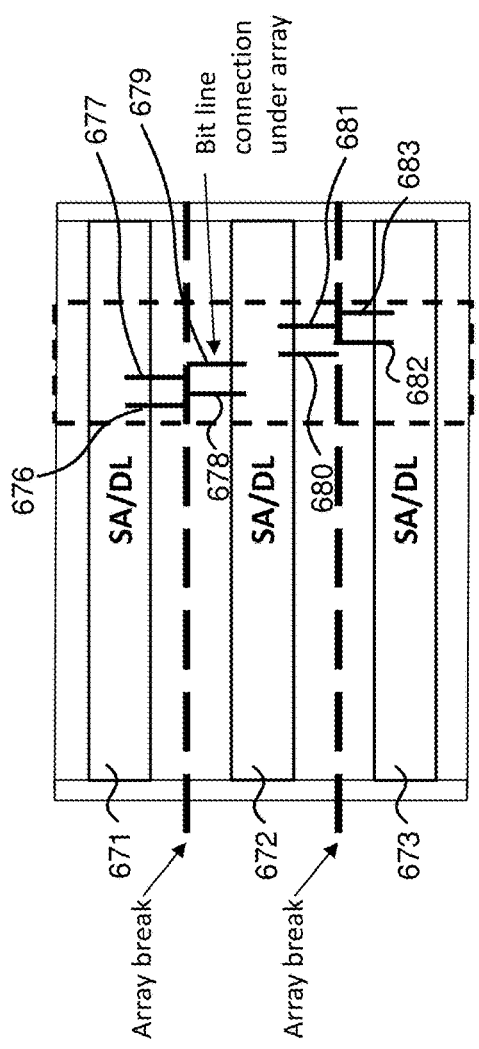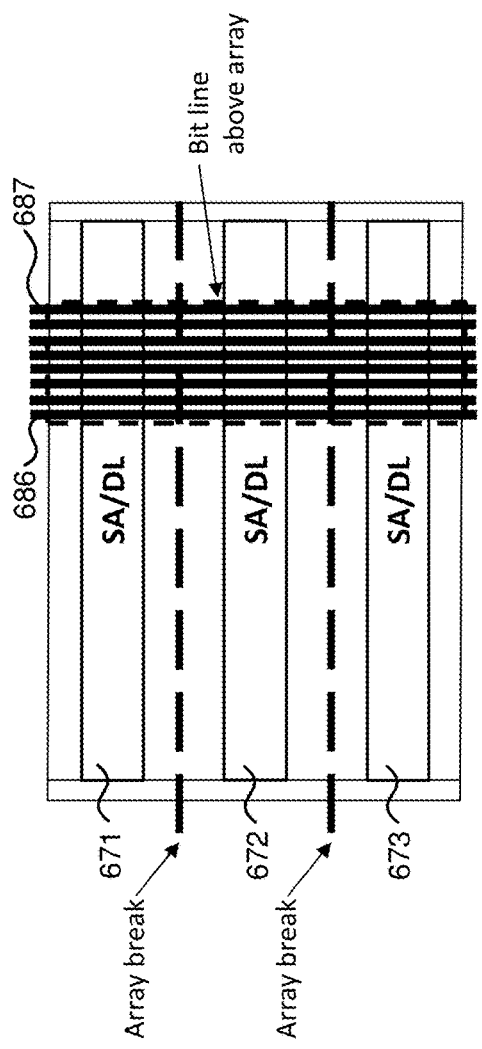

ARCHITECTURE FOR CMOS UNDER ARRAY

CLAIM OF PRIORITY

The present application claims priority to U.S. Provisional Application No. 62/326,720, entitled "Array Architecture," filed Apr. 23, 2016, and to U.S. Provisional Application No. 62/356,385, entitled "New Sense Amp Layout for BiCS CMOS Under Array," filed Jun. 29, 2016, both of which are herein incorporated by reference in their entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in wire resistance and transistor characteristics over process, voltage, and temperature variations.

BRIEF DESCRIPTION OF THE DRAWINGS

FIGS. 3A-3C depict various embodiments of a portion of a three-dimensional memory array.

FIG. 4A depicts one embodiment of a NAND string.

FIG. 4B depicts one embodiment of the NAND string of FIG. 4A using a corresponding circuit diagram.

FIGS. 6C-6D depict one embodiment of a memory array and connections to circuitry located underneath the memory array.

FIGS. 6E-6F depict an alternative embodiment of a memory array and connections to circuitry located underneath the memory array.

DETAILED DESCRIPTION

Figure 1A:
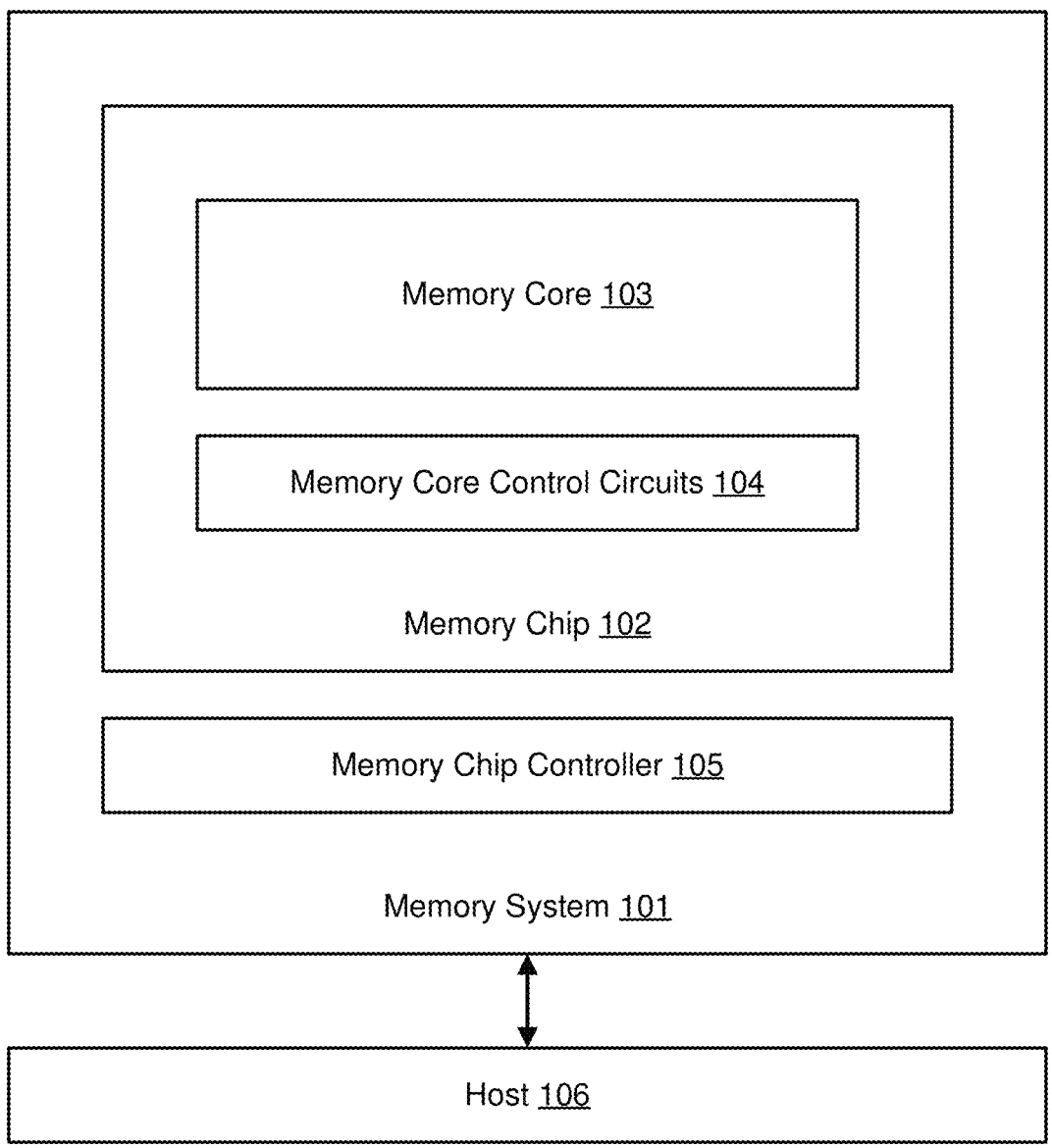
FIGS. 1A-1E depict various embodiments of a memory system.

Technology is described for reducing the area and improving the performance of a non-volatile memory array. The non-volatile memory array may comprise a 3D NAND memory array that includes vertical NAND strings that are arranged orthogonal to a substrate. A vertical NAND string may include floating gate memory cell transistors or charge trap memory cell transistors. Sensing circuitry (e.g., sense amplifiers and other circuitry for sensing the programmed data states of memory cell transistors within a NAND string) may be positioned underneath a 3D NAND memory array and connections from bit lines positioned above the 3D NAND memory array may be made using vertical connections extending though the 3D NAND memory array or through memory breaks within the 3D NAND memory array.

In one embodiment, a memory array may include a first portion of the memory array and a second portion of the memory array that are separated by a memory break region within the memory array. A first set of sense amplifiers may be arranged below the first portion of the memory array and a second set of sense amplifiers may be arranged below the second portion of the memory array. A first bit line in a first metal layer arranged above the memory array may connect to a first set of vertical NAND strings within the first portion of the memory array and connect to a second set of vertical NAND strings within the second portion of the memory array. A second bit line in the first metal layer arranged above the memory array may connect to a third set of vertical NAND strings within the first portion of the memory array and connect to a fourth set of vertical NAND strings within the second portion of the memory array. In some cases, both the first bit line and the second bit line may extend in a bit line direction throughout the memory array. The first bit line may connect to a first sense amplifier of the first set of sense amplifiers arranged below the first portion of the memory array and the second bit line may connect to a second sense amplifier of the second set of sense amplifiers arranged below the second portion of the memory array. The connection from the first bit line to the first sense amplifier may include a first vertical connection within the memory break region and the connection from the second bit line to the second sense amplifier may include a second vertical connection within the memory break region. The first vertical connection and the first bit line may form a first vertical "T" structure and the second vertical connection and the second bit line may form a second vertical "T" structure. In one example, the first set of vertical NAND strings may include floating gate transistors. In another example, the first set of vertical NAND strings may include charge trap transistors.

In some embodiments, a memory array may include a first portion of the memory array, a second portion of the memory array, and a third portion of the memory array. A first set of sense amplifiers may be arranged below the first portion of the memory array, a second set of sense amplifiers may be arranged below the second portion of the memory array, and a third set of sense amplifiers may be arranged below the third portion of the memory array. A first bit line in a first metal layer arranged above the memory array may connect to a first set of vertical NAND strings within the first portion of the memory array, connect to a second set of vertical NAND strings within the second portion of the memory array, and connect to a third set of vertical NAND strings within the third portion of the memory array. A second bit line in the first metal layer arranged above the memory array may connect to a fourth set of vertical NAND strings within the first portion of the memory array, connect to a fifth set of vertical NAND strings within the second portion of the memory array, and connect to a sixth set of vertical NAND strings within the third portion of the memory array. A third bit line in the first metal layer arranged above the memory array may connect to a seventh set of vertical NAND strings within the first portion of the memory array, connect to a eighth set of vertical NAND strings within the second portion of the memory array, and connect to a ninth set of vertical NAND strings within the third portion of the memory array.

In some cases, the first bit line, the second bit line, and the third bit line may all extend in a bit line direction throughout the memory array (e.g., the first bit line, the second bit line, and the third bit line may be positioned above the first portion of the memory array, the second portion of the memory array, and the third portion of the memory array). The first bit line may connect to a first sense amplifier of the first set of sense amplifiers arranged below the first portion of the memory array, the second bit line may connect to a second sense amplifier of the second set of sense amplifiers arranged below the second portion of the memory array, and the third bit line may connect to a third sense amplifier of the third set of sense amplifiers arranged below the third portion of the memory array. The connection from the first bit line to the first sense amplifier may include a first vertical connection positioned between the first portion of the memory array and the second portion of the memory array. The connection from the second bit line to the second sense amplifier may include a second vertical connection positioned between the first portion of the memory array and the second portion of the memory array. The connection from the third bit line to the third sense amplifier may include a third vertical connection positioned between the second portion of the memory array and the third portion of the memory array.

A NAND string may include a tier select gate transistor arranged between and in series with a first set of memory cell transistors and a second set of memory cell transistors. In one embodiment, the number of transistors in the first set of memory cell transistors may be the same as or different from the number of transistors in the second set of memory cell transistors. For example, the first set of memory cell transistors may comprise 16 total transistors and the second set of memory cell transistors may comprise 32 total transistors, 16 total transistors, or 8 total transistors. One end of the first set of memory cell transistors may connect to a bit line while the other end of the first set of memory cell transistors may be connected to the tier select gate transistor. In this case, the tier select gate transistor may electrically isolate the first set of memory cell transistors from the second set of memory cell transistors when the tier select gate transistor is set into a non-conducting state. The tier select gate transistor within the NAND string may not comprise a user accessible memory cell transistor as the tier select gate transistor may not be able to store user data.

In one embodiment, a non-volatile storage system or a memory die may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
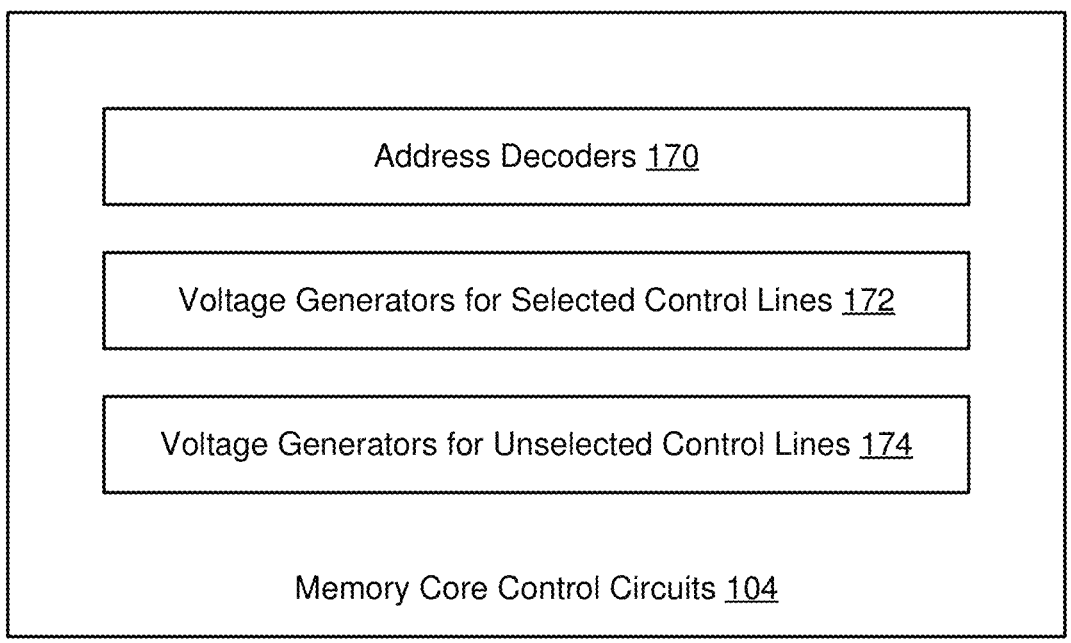

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1C:
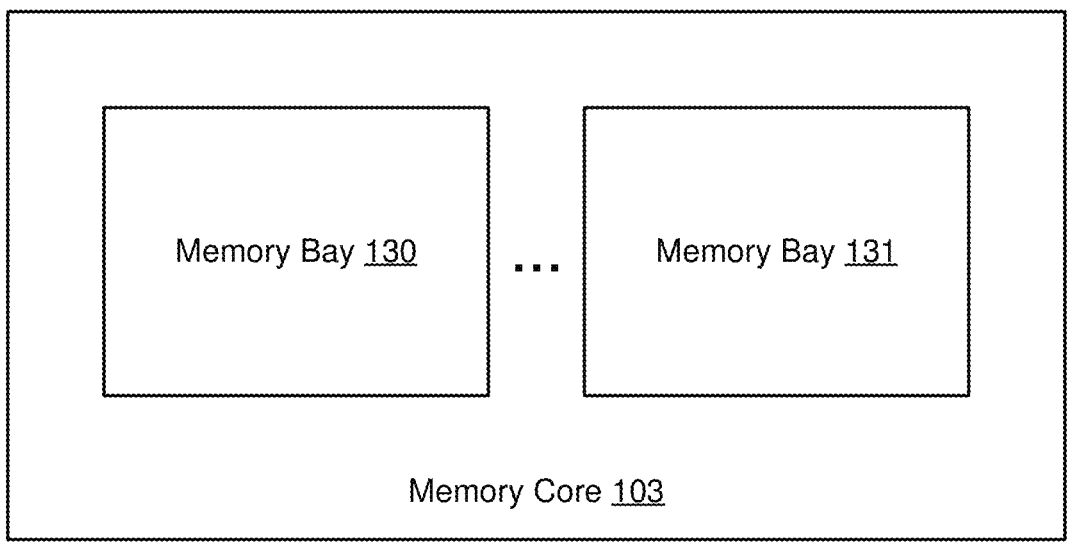
Figure 1D:
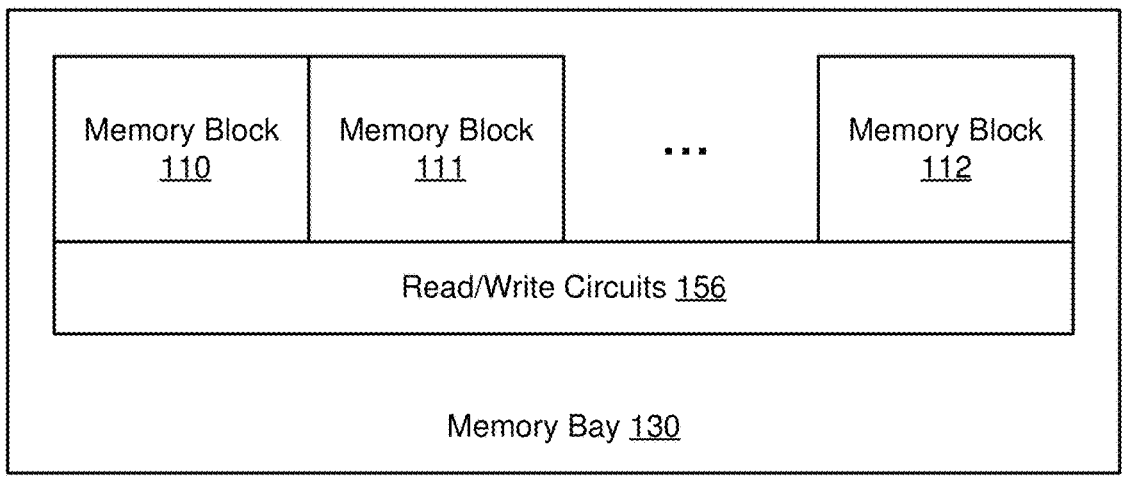
Figure 1E:
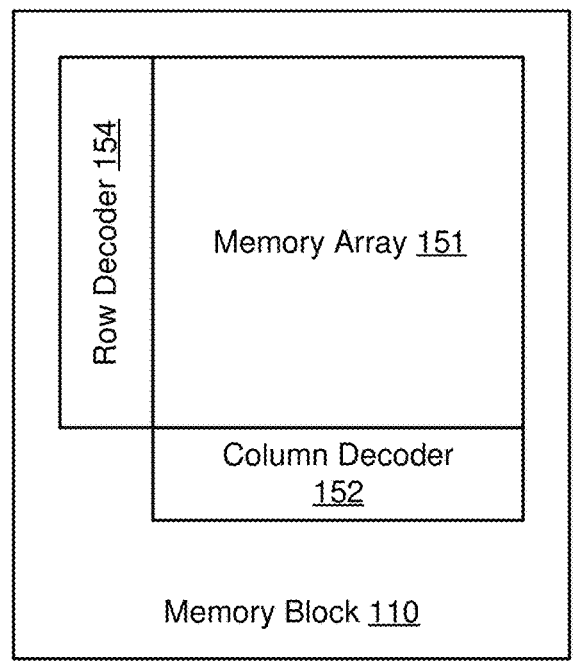

FIGS. 1C-1E depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

FIG. 1C depicts one embodiment of memory core 103 in FIG. 1A. As depicted, memory core 103 includes memory bay 130 and memory bay 131. In some embodiments, the number of memory bays per memory core can be different for different implementations. For example, a memory core may include only a single memory bay or a plurality of memory bays (e.g., 16 memory bays or 256 memory bays).

FIG. 1D depicts one embodiment of memory bay 130 in FIG. 1C. As depicted, memory bay 130 includes memory blocks 110-112 and read/write circuits 156. In some embodiments, the number of memory blocks per memory bay may be different for different implementations. For example, a memory bay may include one or more memory blocks (e.g., 32 memory blocks per memory bay). Read/write circuits 156 include circuitry for reading and writing memory cells within memory blocks 110-112. As depicted, the read/write circuits 156 may be shared across multiple memory blocks within a memory bay. This allows chip area to be reduced since a single group of read/write circuits 156 may be used to support multiple memory blocks. However, in some embodiments, only a single memory block may be electrically coupled to read/write circuits 156 at a particular time to avoid signal conflicts.

In some embodiments, read/write circuits 156 may be used to write one or more pages of data into the memory blocks 110-112 (or into a subset of the memory blocks). The memory cells within the memory blocks 110-112 may permit direct over-writing of pages (i.e., data representing a page or a portion of a page may be written into the memory blocks 110-112 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 156 may be used to program a particular memory cell to be in one of three or more data/resistance states (i.e., the particular memory cell may comprise a multi-level memory cell). In one example, the read/write circuits 156 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 156 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

FIG. 1E depicts one embodiment of memory block 110 in FIG. 1D. As depicted, memory block 110 includes a memory array 151, row decoder 154, and column decoder 152. Memory array 151 may comprise a contiguous group of memory cells having contiguous word lines and bit lines. Memory array 151 may comprise one or more layers of memory cells. Memory array 151 may comprise a two-dimensional memory array or a three-dimensional memory array. The row decoder 154 decodes a row address and selects a particular word line in memory array 151 when appropriate (e.g., when reading or writing memory cells in memory array 151). The column decoder 152 decodes a column address and selects a particular group of bit lines in memory array 151 to be electrically coupled to read/write circuits, such as read/write circuits 156 in FIG. 1D. In one embodiment, the number of word lines is 4K per memory layer, the number of bit lines is 1K per memory layer, and the number of memory layers is 4, providing a memory array 151 containing 16M memory cells.

In one embodiment, memory array 151 may comprise memory cells that are oriented in a horizontal plane that is horizontal to the supporting substrate. In another embodiment, memory array 151 may comprise memory cells that are oriented in a vertical plane that is vertical with respect to the supporting substrate (i.e., the vertical plane is perpendicular to the supporting substrate). In this case, the bit lines of memory array 151 may comprise vertical bit lines.

Figure 2A:
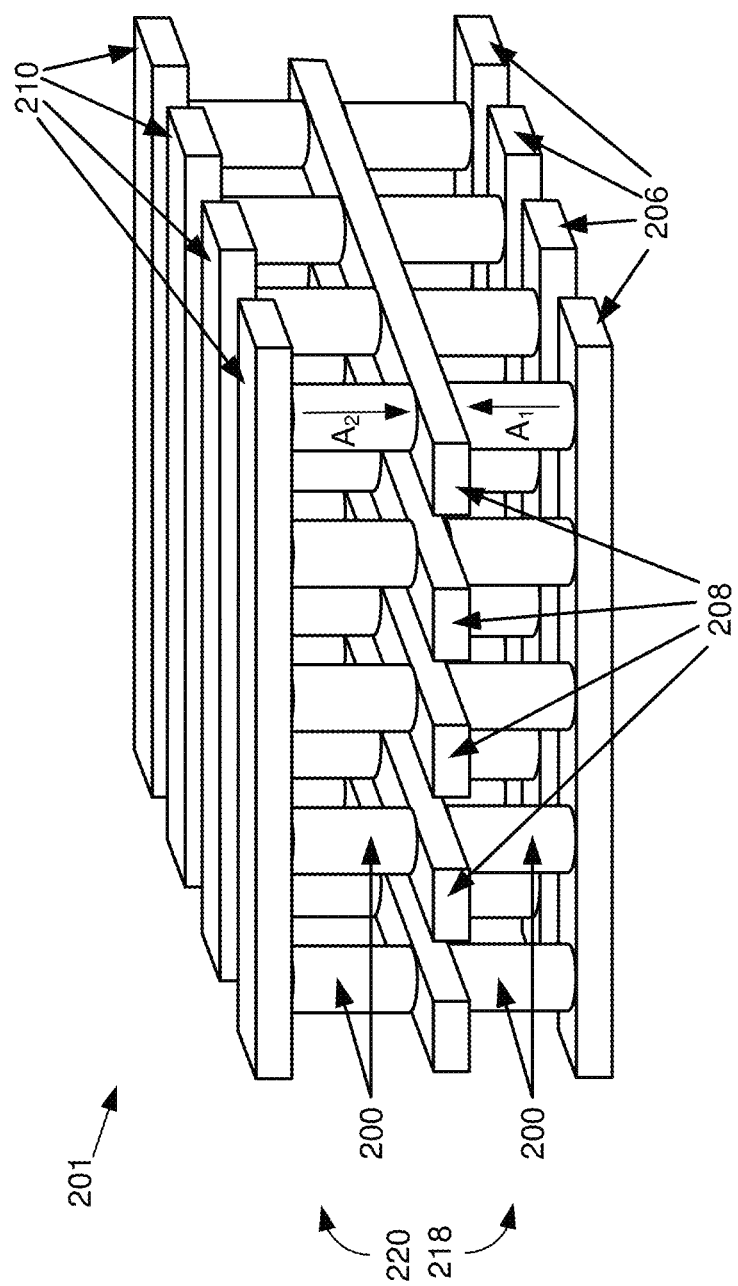
FIGS. 2A-2B depict various embodiments of a cross-point memory array.

FIG. 2A depicts one embodiment of a portion of a monolithic three-dimensional memory array 201 that includes a second memory level 220 positioned above a first memory level 218. Memory array 201 is one example of an implementation for memory array 151 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current (s). When used in a memory cell, one resistance state may represent a binary data "0" while another resistance state may represent a binary data "1." In some cases, a memory cell may be considered to comprise more than two data/ resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
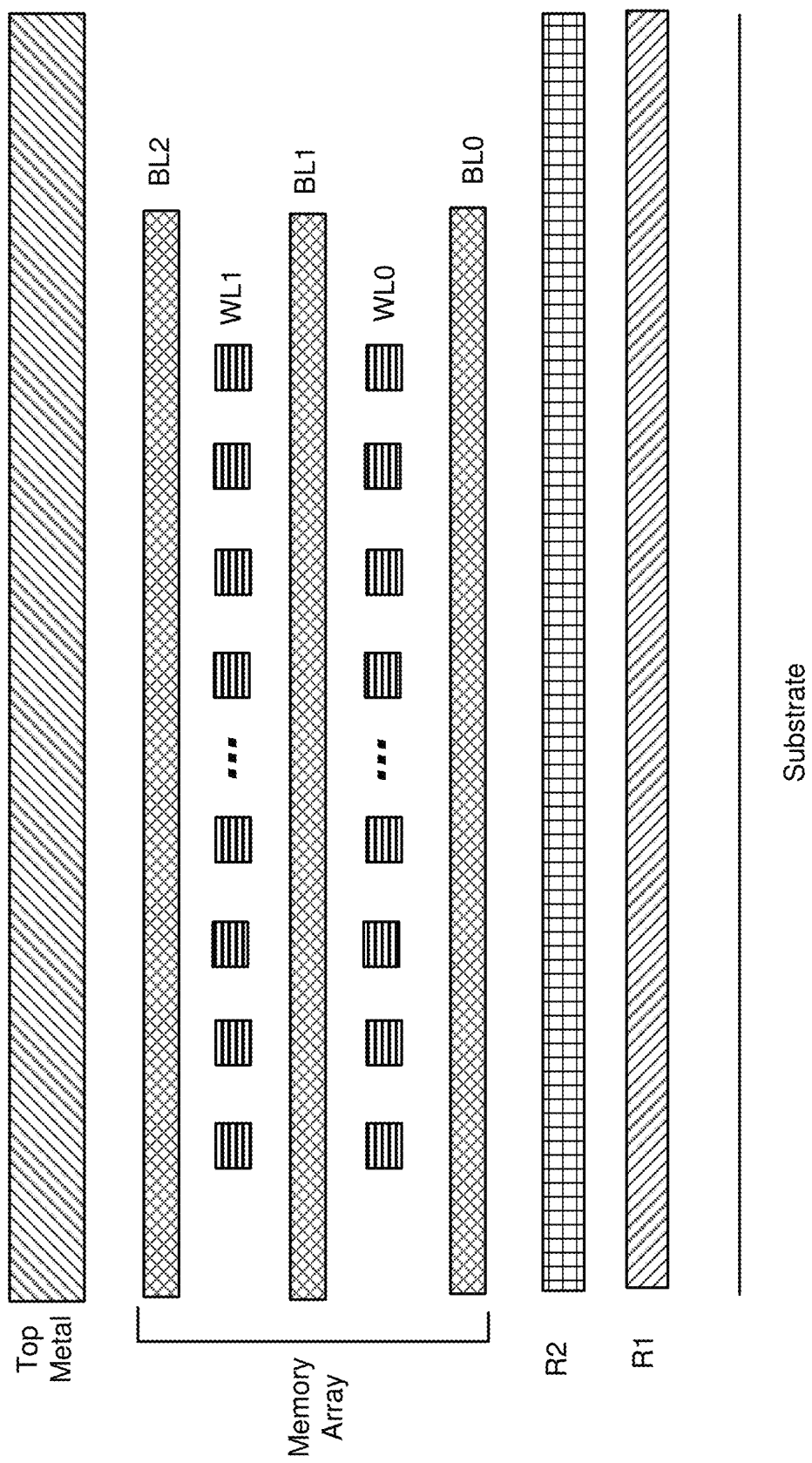

FIG. 2B depicts a subset of the memory array and routing layers of one embodiment of a three-dimensional memory array, such as memory array 151 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
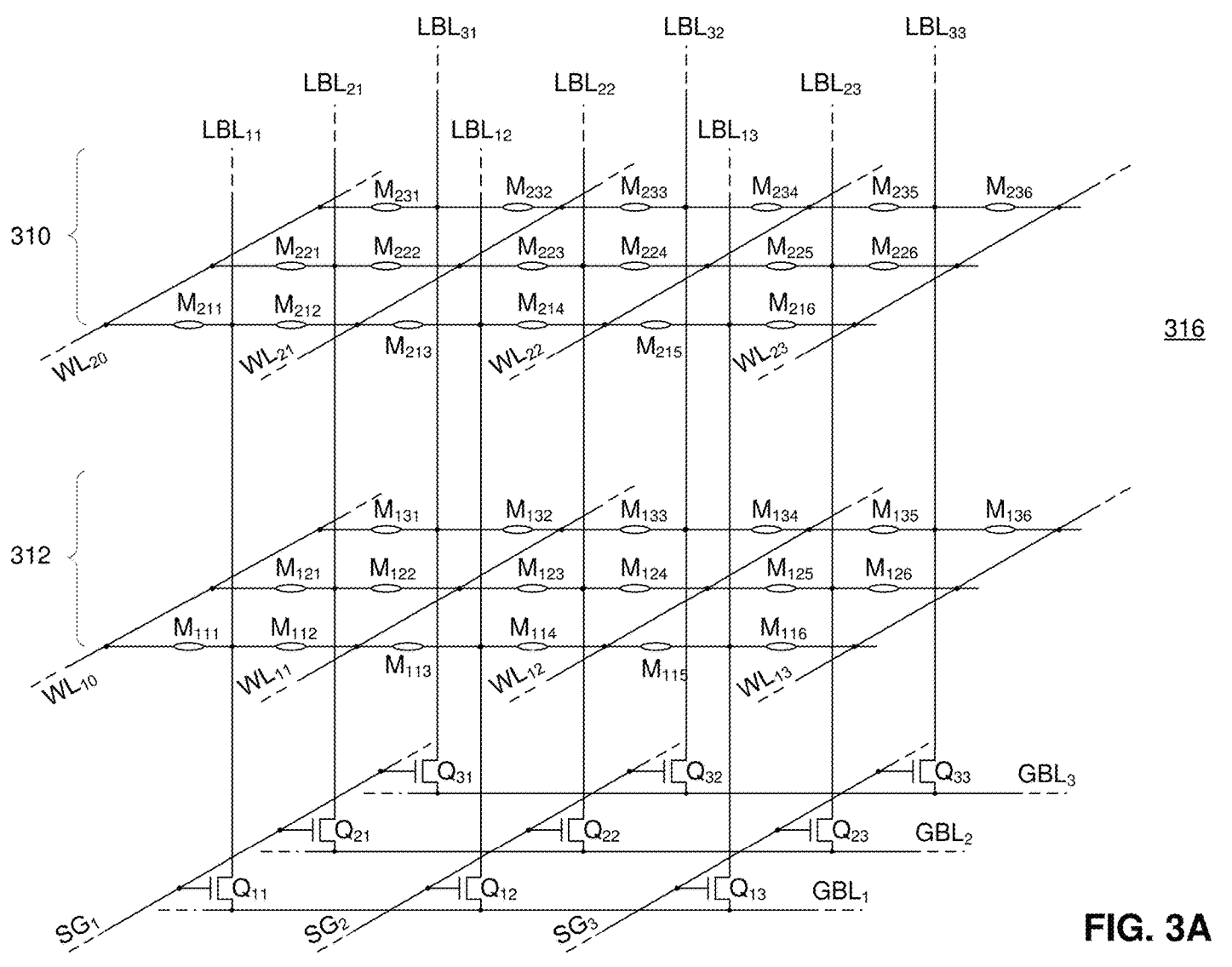

FIG. 3A depicts one embodiment of a portion of a monolithic three-dimensional memory array 316 that includes a first memory level 312 positioned below a second memory level 310. Memory array 316 is one example of an implementation for memory array 151 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 316, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 3B:
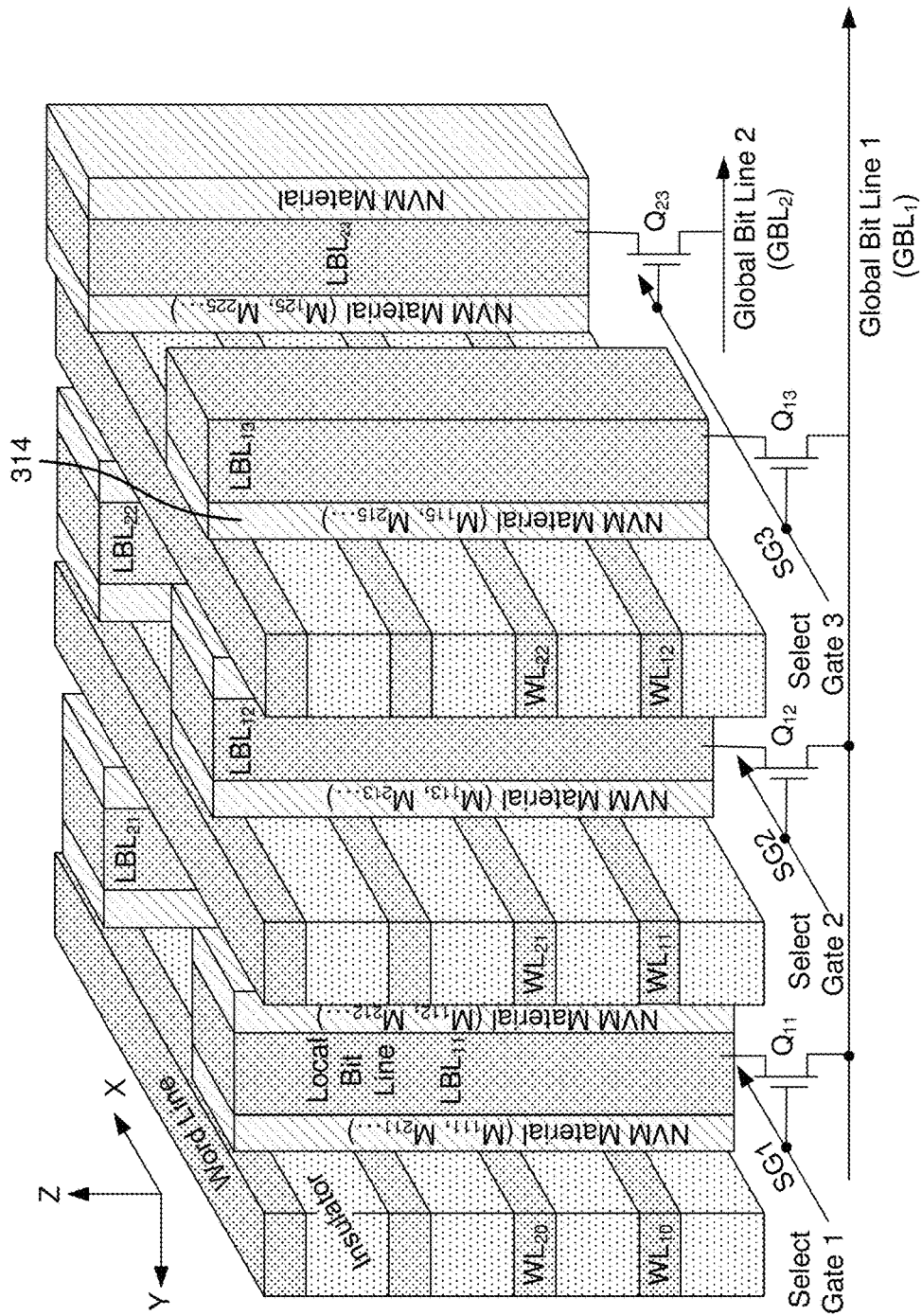

FIG. 3B depicts one embodiment of a portion of a monolithic three-dimensional memory array that includes vertical strips of a non-volatile memory material. The physical structure depicted in FIG. 3B may comprise one implementation for a portion of the monolithic three-dimensional memory array depicted in FIG. 3A. The vertical strips of non-volatile memory material may be formed in a direction that is perpendicular to a substrate (e.g., in the Z direction). A vertical strip of the non-volatile memory material 314 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 314 may comprise a part of a first memory cell associated with the cross section between $WL_{12}$ and $LBL_{13}$ and a part of a second memory cell associated with the cross section between $WL_{22}$ and $LB_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

FIG. 3C depicts a cross-sectional view of a memory structure using the vertically oriented select devices shown in FIG. 3B. The memory structure of FIG. 3C may comprise a continuous mesh array of memory elements because there are memory elements connected to both sides of the bit lines and memory elements connected to both sides of the word lines. At the bottom of FIG. 3C, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched therebetween. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 3B), which are labeled in FIG. 3C as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a $TiO_2$ switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 3C also shows an n+ polysilicon layer 524. As depicted, the npn TFT of vertically oriented select devices 504 can be used to connect the global bit line GBL (layer 526) with any of the vertical bit lines 530.

Moreover, FIG. 3C shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region, which may allow the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

FIG. 4A depicts one embodiment of a NAND string 90. FIG. 4B depicts one embodiment of the NAND string of FIG. 4A using a corresponding circuit diagram. As depicted, NAND string 90 includes four transistors 472-475 in series between a first select gate 470 (i.e., a drain-side select gate) and a second select gate 471 (i.e., a source-side select gate). Select gate 470 connects the NAND string 90 to a bit line 426 and is controlled by applying the appropriate voltage to the select line SGD. In this case, the bit line 426 is directly connected to the drain side end of the NAND string. Select gate 471 connects the NAND string 90 to a source line 428 and is controlled by applying the appropriate voltage to the select line SGS. In this case, the source line 428 is directly connected to the source-side end of the NAND string 90. The gates of transistors 472-475 are connected to word lines WL3, WL2, WL1, and WL0, respectively.

Note that although FIGS. 4A-4B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a p-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 4C:
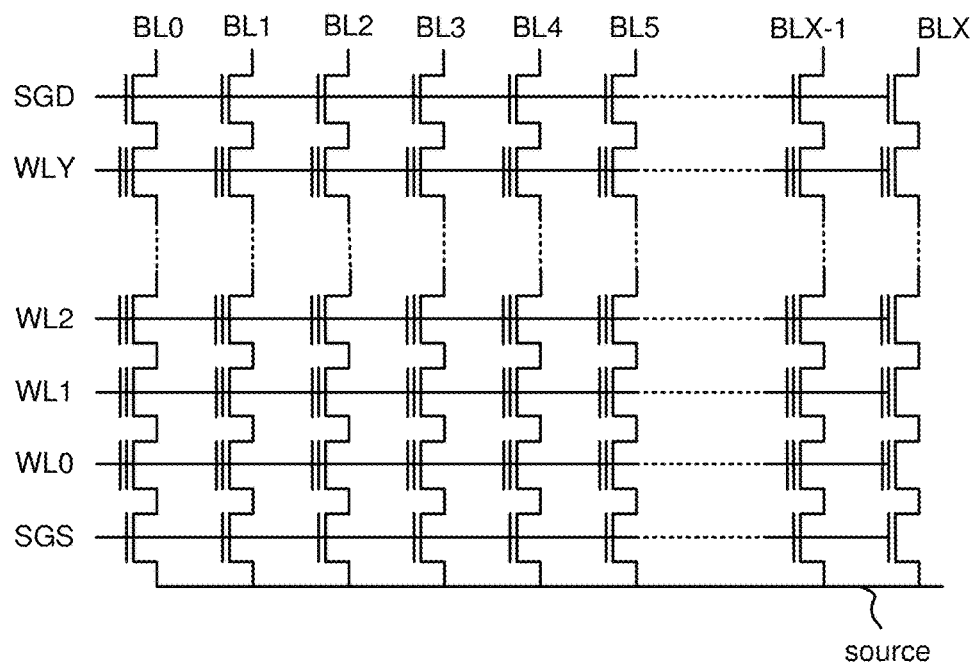
FIG. 4C depicts one embodiment of a memory block including a plurality of NAND strings.

FIG. 4C depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are several ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

In some cases, during a read operation or a sensing operation, the source-side selection signal SGS may be set to a particular voltage (e.g., 7V or 10V) to pass the voltage applied to the source line (source) to the source junction of the floating gate transistors whose gates are connected to WL0 or the word line closest to the source-side select gate.

Figure 4D:
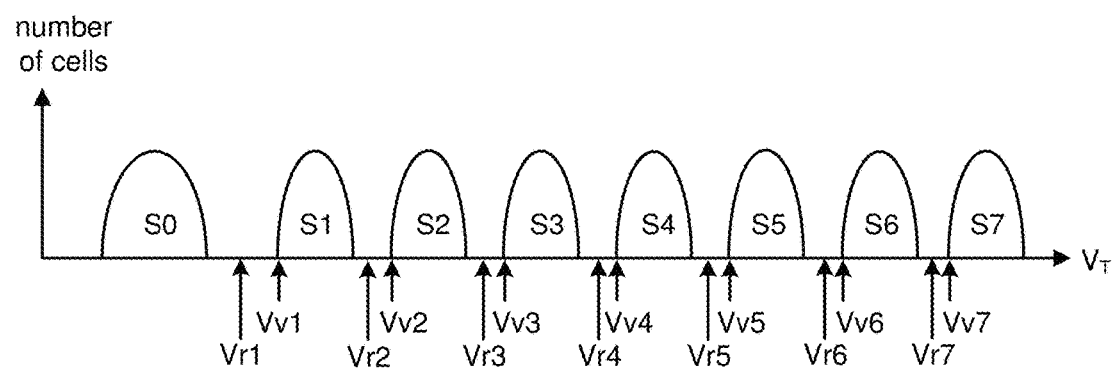
FIG. 4D depicts one embodiment of possible threshold voltage distributions for a three-bit-per-cell memory cell.

FIG. 4D depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4F:
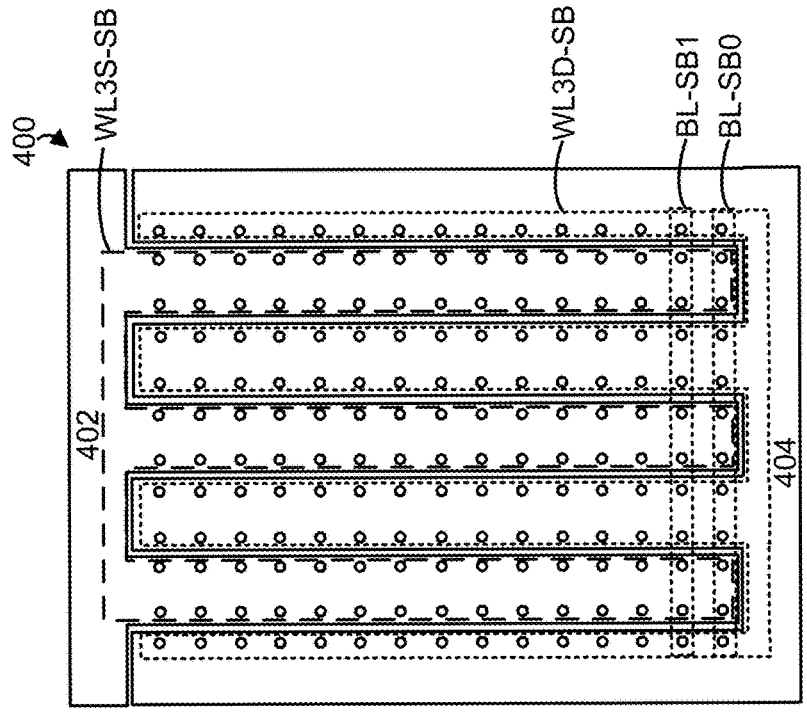
FIGS. 4E-4H depict various embodiments of NAND structures.
Figure 4E:
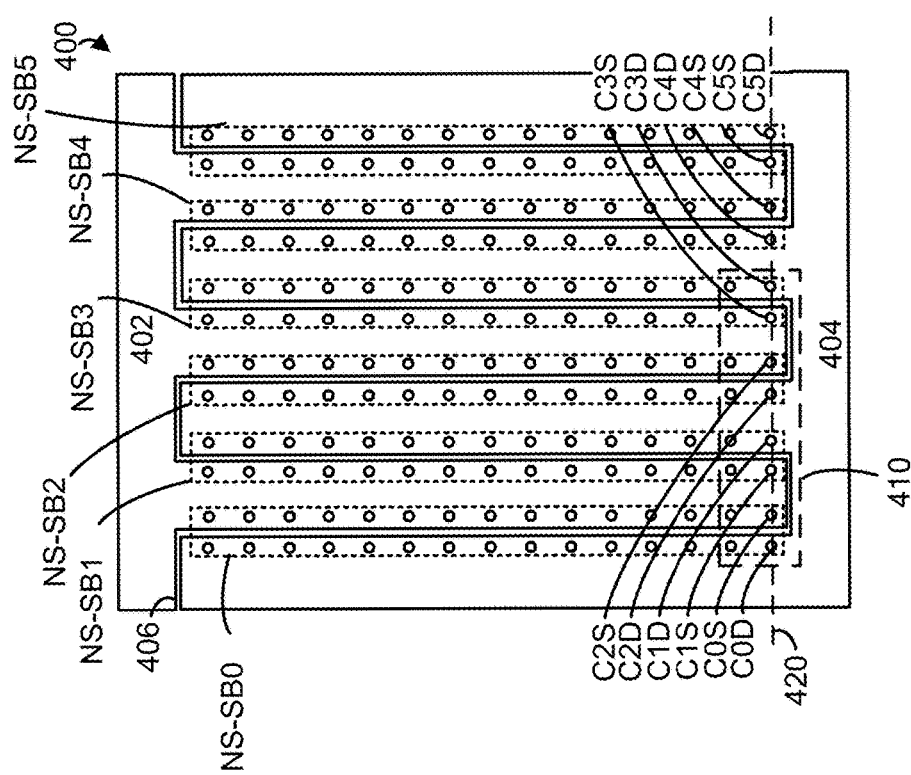

FIG. 4E depicts a top view of U-shaped NAND strings that are part of a memory block 400. The block 400 may include NAND string sub-blocks NS-SB0 to NS-SB5. Block 400 may comprise one example implementation of memory block 110 in FIG. 1D. The top view depicts a representative word line layer among multiple word line layers in a stack that includes alternating dielectric and conductive layers. The conductive layers may include doped polysilicon or metal silicide and the dielectric layers may include silicon dioxide. The word line layer is divided into two portions (or planes) 402 and 404. Each word line layer portion can be considered to be a word line, and is connected to control gates of associated memory cells.

Each block includes a slit pattern. A slit may refer to a void which extends vertically in the stack, typically from an etch stop layer at the bottom to at least a top layer of the stack. A slit 406 is a single continuous slit which extends in a zig-zag pattern in the block so that the block is divided into the two portions 402 and 404 that are insulated from one another. This approach can provide greater flexibility in controlling the memory cells since the two word line layer portions can be driven independently at each layer or height in the stack. Each block includes rows of vertical memory holes or pillars, represented by circles. The memory holes extend vertically in the stack and include memory cells such as in a vertical NAND string. An example column of memory cells along a line 420 includes C0D to C5D (D denotes a drain side column and S denotes a source side column).

FIG. 4F depicts the block 400 in FIG. 4E showing example word line subsets WL3D-SB and WL3S-SB and example bit line subsets BL-SB0 and BL-SB1. WL3S-SB is a portion of a word line layer (e.g., the third word line layer) connected to one memory cell in the source-side of each U-shaped NAND string, and WL3D-SB is a portion of the word line layer connected to one memory cell in the drain-side of each U-shaped NAND string. When U-shaped NAND strings (or pipe-shaped NAND strings) are used, each NAND string sub-block can include two adjacent rows of columns of memory cells. In the sub-block, the adjacent rows are separated by the slit. The columns of memory cells on one side of the slit are drain-side columns (e.g., C0D, C1D, C2D and C3D in FIG. 4E) of NAND strings, and the columns of memory cells on the other side of the slit are source-side columns (e.g., C0S, C1S, C2S and C3S in FIG. 4E) of the NAND strings. Word line drivers can independently provide signals such as voltage waveforms to the word line layer portions 402 and 404.

Figure 4G:
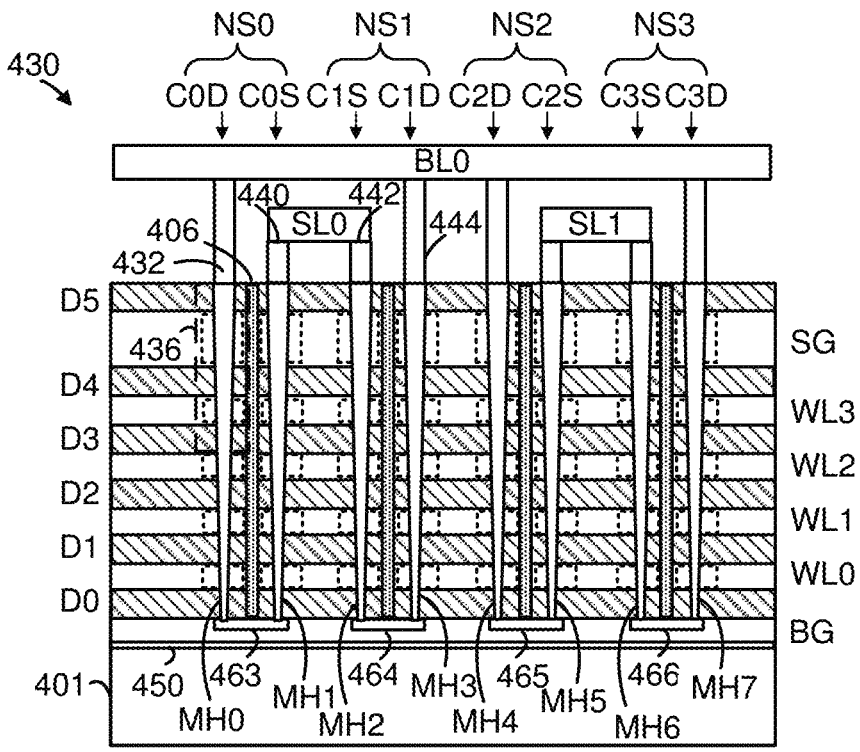

FIG. 4G depicts a cross-sectional view of the portion 410 of the block 400 of FIG. 4E along line 420. Columns of memory cells are depicted in the multi-layer stack. The portion 410 includes the substrate 401, an insulating film 450 on the substrate, and a back gate layer BG, which is a conductive layer on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 466 which connect the columns. The back gate connects the two columns of each U-shaped NAND string. For example, NS0 (NS=NAND string) includes columns C0D and C0S and connecting portion 463 and has a drain end 432 and a source end 440. NS1 includes columns C1S and CM and connecting portion 464 and has a drain end 444 and a source end 442. NS2 includes columns C2D and C2S and connecting portion 465. NS3 includes columns C3S and C3D and connecting portion 466. The source line SL0 is connected to the source ends 440 and 442 of two adjacent memory strings NS0 and NS1. Additional U-shaped NAND strings in the stack 430 may extend behind the U-shaped NAND strings depicted in the cross-section. The U-shaped NAND strings NS0-NS3 are each in a different NAND string sub-block, but are in a common BL subset. The bit line BL0 connects to the drain ends 432 and 444. Memory holes MH0-MH7 are depicted extending vertically in the stack and correspond with respective memory holes for the memory cells of the NAND strings.

Figure 4H:
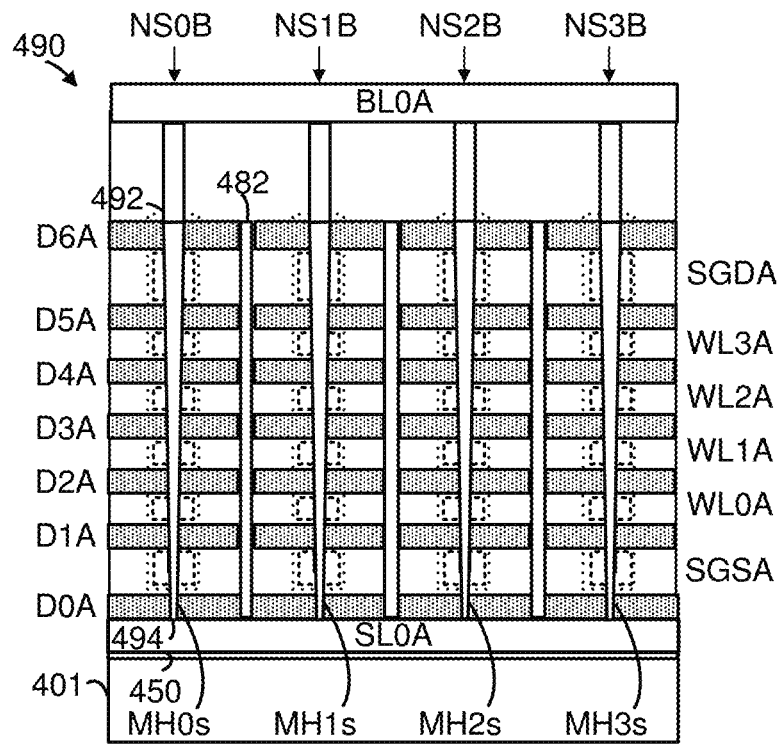

FIG. 4H depicts a cross-sectional view of a single vertical NAND string architecture. As depicted, vertical strings of memory cells corresponding with NAND strings NS0B, NS1B, NS2B and NS3B are depicted in the multi-layer stack 490. The stack 490 includes a substrate 401, an insulating film 450 on the substrate, and a portion of a source line SL0A arranged above the insulating film 450. NAND string NS0B has a source end 494 and a drain end 492. A portion of a bit line BL0A is also depicted. Dashed lines depict memory cells and select gate transistors. Memory holes MH0s, MH1s, MH2s and MH3s are associated with NAND strings NS0B, NS1B, NS2B and NS3B. Word line layers are WL0A, WL1A, WL2A and WL3A. Dielectric layers are D0A, D1A, D2A, D3A, D4A, D5A and D6A. SGSA is a source-side select gate layer and SGDA is a drain-side select gate layer. As depicted, in contrast to U-shaped NAND strings in which the source lines and bit lines connect to the U-shaped NAND strings at the top of the NAND strings, with single vertical NAND strings the bit lines connect to the vertical NAND strings at the top of the NAND strings and the source lines connect to the vertical NAND strings at the bottom of the NAND strings.

Figure 5:
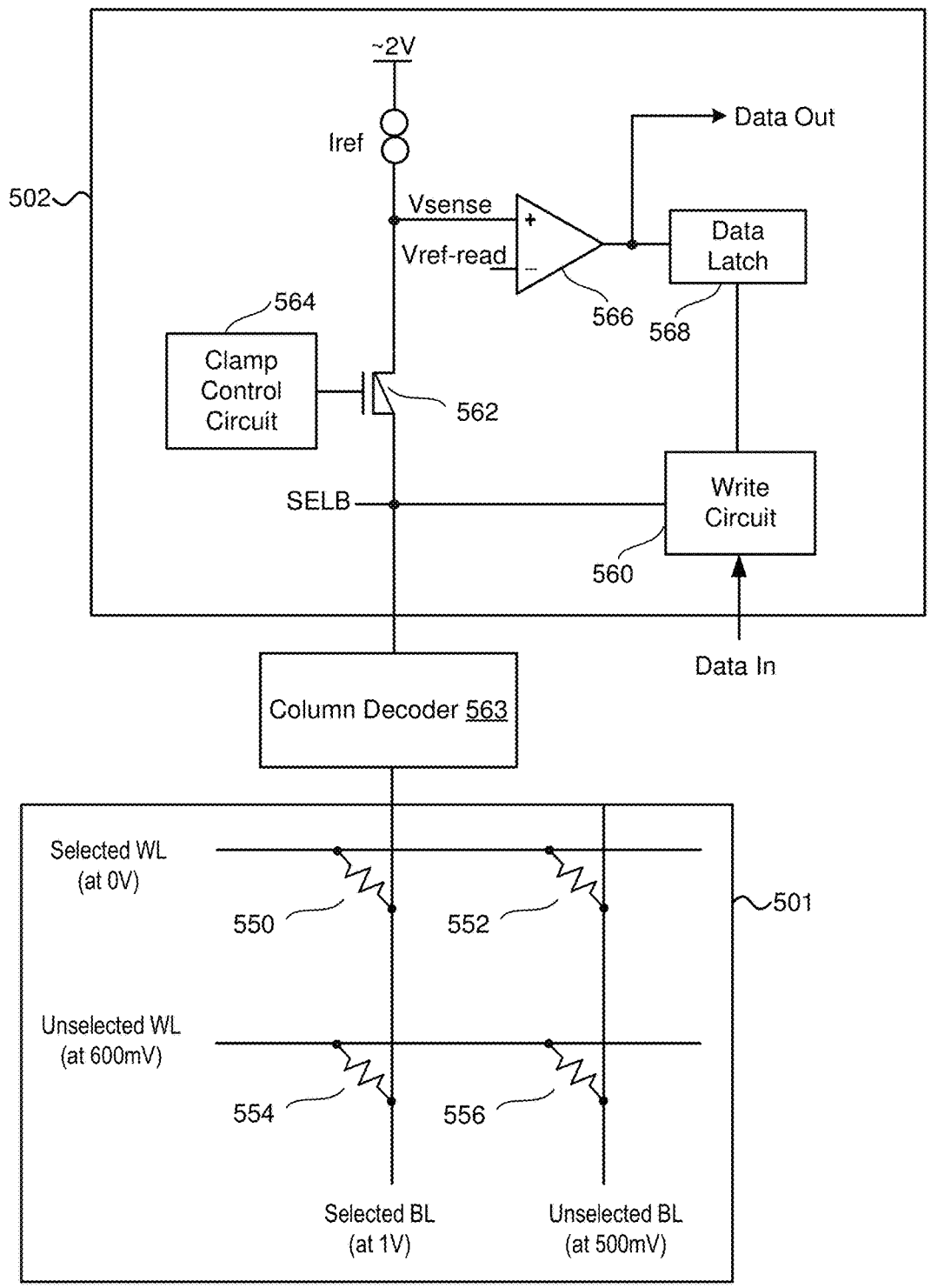
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 156 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 316 in FIG. 3A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 563. In one embodiment, column decoder 563 may correspond with column decoder 152 depicted in FIG. 1E. Transistor 562 couples (or electrically connects)

node SELB to the Vsense node. The transistor 562 may comprise a low VT nMOS device. Clamp control circuit 564 controls the gate of transistor 562. The Vsense node is connected to reference current Tref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Tref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Tref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
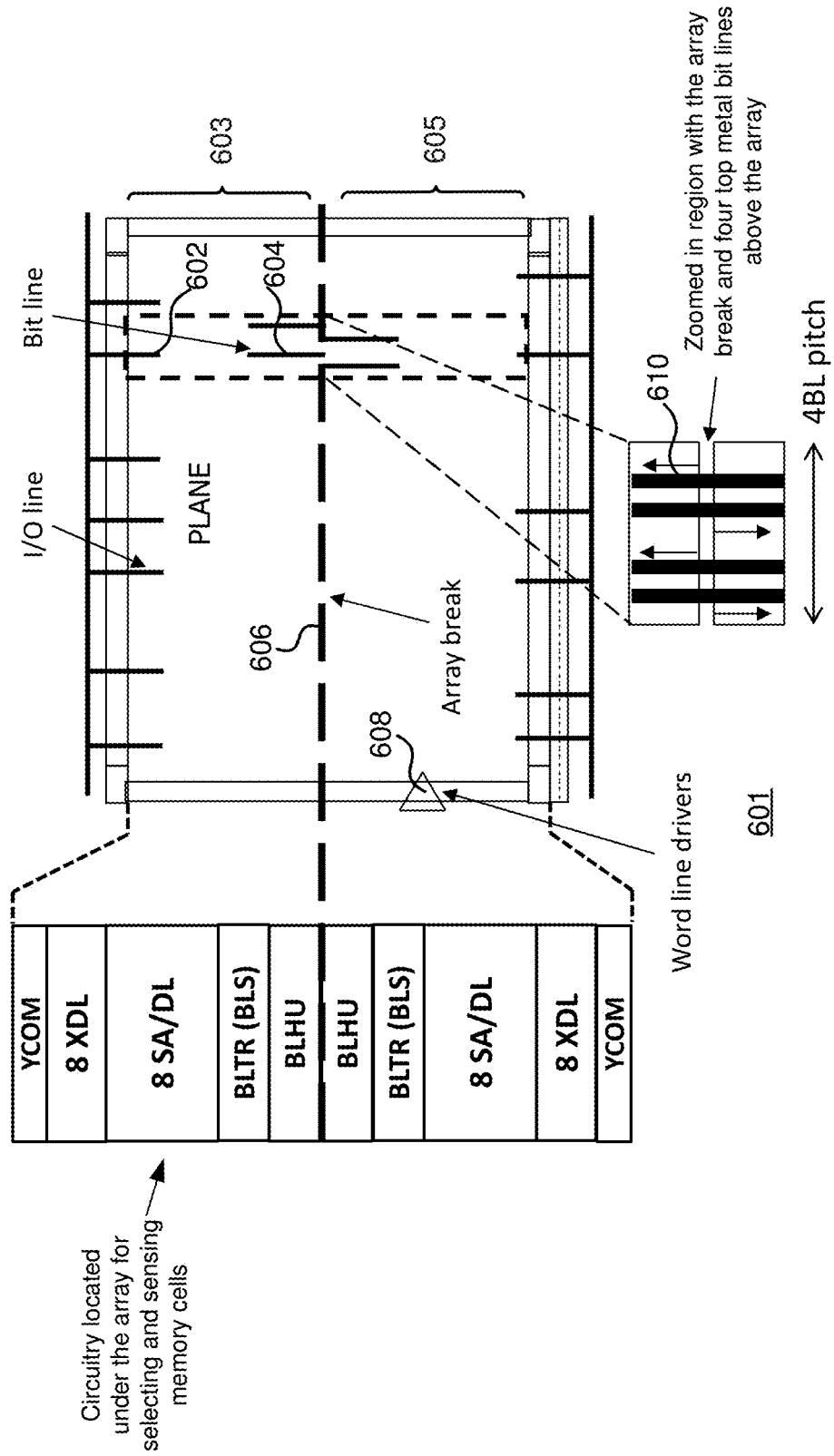
FIG. 6A depicts a top plan view of one embodiment of a memory array.

FIG. 6A depicts a top plan view of one embodiment of a memory array 601 (or memory plane). The memory array 601 includes a first portion 603 of the memory array arranged above the array break 606 and a second portion 605 of the memory array arranged below the array break 606. The array break 606 may comprise a region within the memory array 601 in which vertical connections may be made between wires positioned above the memory array and wires positioned below the memory array. One example of a vertical connection is the vertical connection 622 in FIG. 6B connecting a bit line 620 arranged above a memory array to routing layers below the memory array. The vertical connection 622 in FIG. 6B may comprise a representative example of a means for connecting a sensing circuit arranged below a memory array to a bit line arranged above the memory array. In some cases, the vertical connections between top metal bit lines positioned above the memory array and local bit lines positioned below the memory array may be positioned within a vertical routing region. The vertical routing region may be located within the array break 606. In some cases, the resistance per square of wires arranged above the memory array may be less than the resistance per square of wires arranged below the memory array. For example, the routing layers above the memory array may use aluminum or copper and the routing layers below the memory array may use tungsten.

Located underneath the first portion 603 of the memory array are support circuitry for the memory array including sense amplifiers and data latches SA/DL, bit line drivers BLTR (e.g., the last stage decoders or select transistors for driving bit lines), and other data latches XDL. The bit line drivers BLTR in FIG. 6A may correspond with the column decoder 563 in FIG. 5 and may be used to select one of a number of bit lines to be connected to a sense amplifier or other sensing circuitry. Also located underneath the first portion 603 of the memory array is a bit line hookup area BLHU or a designated routing hookup area for connecting wires arranged underneath the memory array. As depicted, a wire 604 arranged underneath the first portion 603 of the memory array may connect a vertical conductor (e.g., one or more vias) within the array break 606 to a sense amplifier arranged underneath the first portion 603 of the memory array. An I/O line 602 or data/control line (e.g., an input data line or a control line for a sense amplifier) may use routing tracks also located underneath the first portion 603 of the memory array. Located underneath the second portion 605 of the memory array are support circuitry similar to the support circuitry located underneath the first portion 603 of the memory array. At the edges or sides of the memory array are arranged word line drivers (e.g., the last state decoder for driving the word lines), such as word line driver 608, that connect to word lines within the memory array.

As depicted in FIG. 6A, bit lines in a metal layer arranged above the memory array, such as bit line 610, may extend across the memory array (e.g., may extend over both the first portion 603 and the second portion 605 of the memory array) in a bit line direction and word lines (driven by the word line drivers) may extend across the memory array in a word line direction orthogonal to the bit line direction. In one embodiment, the bit line 610 may correspond with bit line BL0 in FIG. 4G or bit line BL0A in FIG. 4H. In these cases, the bit line 610 may be arranged above the memory array and connect to the drain-side end of 3D NAND strings. In order for bit lines located above the memory array to connect to the appropriate sense amplifiers located below the memory array, a vertical routing region between the first portion 603 and the second portion 605 of the memory array may be utilized. The vertical routing region may correspond with the array break 606 in FIG. 6A, within which a plurality of vertical connection or vias may be used to connect wires positioned above the memory array and wires positioned below the memory array. In one example, even numbered bit lines (e.g., BL2 and BL4) may connect to sense amplifiers located below the first portion 603 of the memory array and odd numbered bit lines (e.g., BL1 and BL3) may connect to sense amplifiers located below the second portion 605 of the memory array. Other signal lines and/or power and ground lines may also utilize the vertical routing region.

Figure 6B:
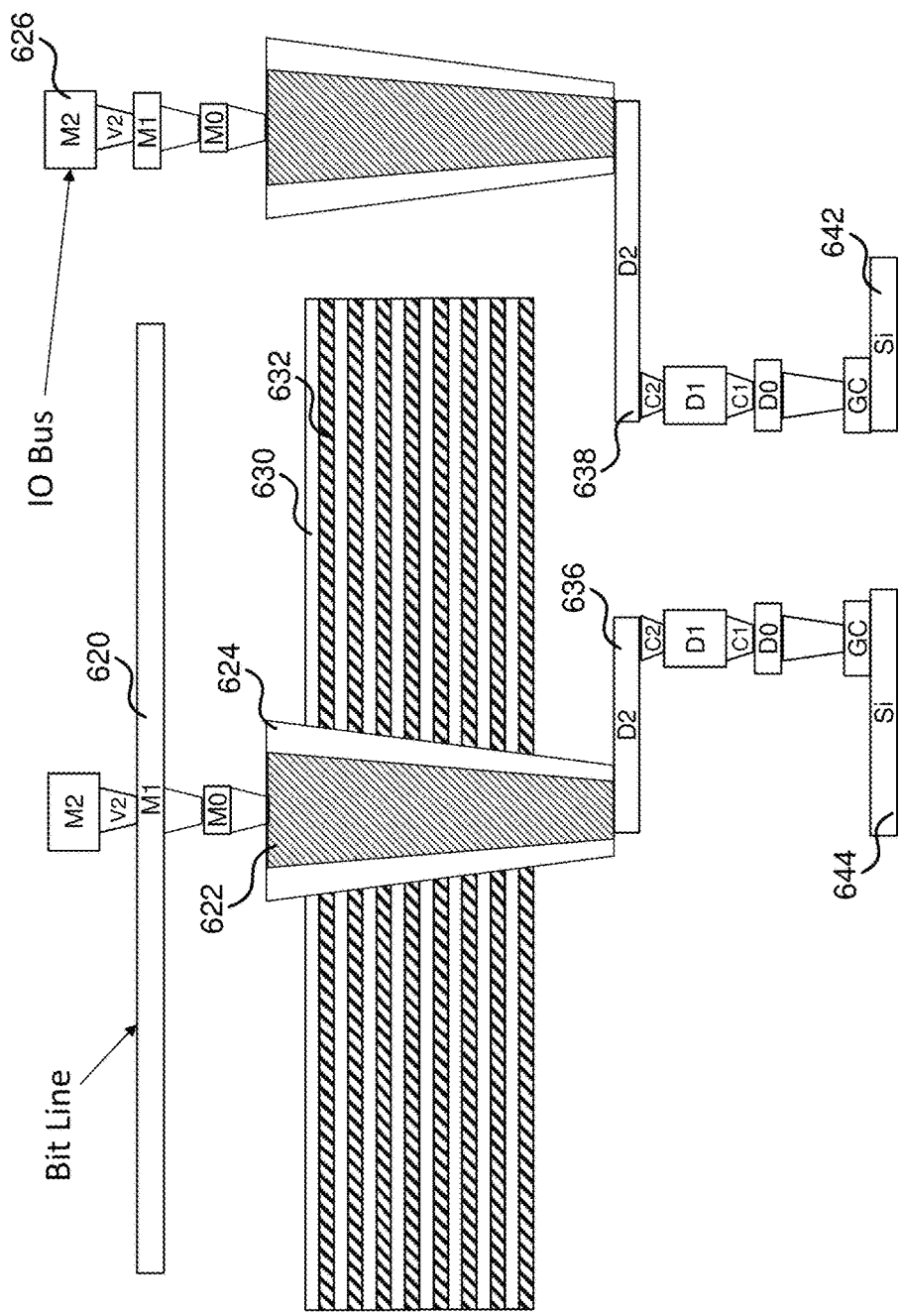
FIG. 6B depicts a side view of one embodiment of a memory array.

FIG. 6B depicts a side view of one embodiment of a memory array. As depicted, a bit line 620 is arranged above a memory array comprising word line layers including word line layer 632 and dielectric layers including dielectric layer 630. The bit line 620 may correspond with bit line 610 in FIG. 6A. A vertical connection from the bit line 620 to circuitry located underneath the memory array may include a via or contact 622 surrounded by a dielectric 624 to electrically isolate the contact 622. The bit line 620 may be in a metal1 layer (M1) and may connect to a metal0 layer (M0) arranged between the metal1 layer and the memory array by a via. The contact 622 may comprise a tungsten contact. The contact 622 may connect to a routing track 636 in the routing layer D2 located underneath the memory array and eventually connect to a transistor diffusion 644 of the circuitry located underneath the memory array. In one example, the circuitry located underneath the memory array may include a portion of a sense amplifier or a portion of a bit line driver. The connection from the routing track 636 to the transistor diffusion 644 may be formed using routing layers below the memory array (e.g., D2, D1, and D0). An I/O bus signal line 626 may also connect to circuitry located underneath the memory array using a vertical connection located outside of the memory array. As depicted, the I/O bus signal line 626 may connect to a routing signal line 638 in the routing layer D2 and then connect to another transistor diffusion 642 corresponding with a transistor of the sense amplifier. Both the routing track 636 and the routing signal line 638 may include tracks located underneath the memory array. As depicted in FIG. 6B, the bit line 620 in the metal1 layer and the vertical connections including the contact 622 form a "T" shaped routing structure. One benefit of this vertical structure is that the RC delay of the connection or the worst-case resistance from a memory cell to a sense amplifier may be cut in half.

FIGS. 6C-6D depict one embodiment of a memory array and connections to circuitry located underneath the memory array. As depicted in FIG. 6C, a first set of sense amplifiers 657 may be arranged underneath a first portion of the memory array and a second set of sense amplifiers 658 may be arranged underneath a second portion of the memory array. A first lower layer routing connection 652 may connect a first bit line 662 arranged above the memory array to a first sense amplifier of the first set of sense amplifiers 657 or connect the first bit line 662 arranged above the memory array to a first bit line driver (or last stage decoder) that connects the first bit line to the first sense amplifier. A second lower layer routing connection 654 may connect a second bit line 664 arranged above the memory array to a second sense amplifier of the second set of sense amplifiers 658 or connect the second bit line 664 arranged above the memory array to a second bit line driver (or last stage decoder) that connects the second bit line to the second sense amplifier.

As depicted in FIG. 6D, the first bit line 662 and the second bit line 664 may be arranged above the memory array in a metal routing layer located above the memory array (e.g., the metal1 or M1 routing layer). The metal routing layer may include routing tracks made of aluminum or copper wires. The first bit line 662 and the second bit line 664 extend across both the first portion and the second portion of the memory array. The first bit line 662 may correspond with bit line BL0 in FIG. 4G or bit line BL0A in FIG. 4H. The first bit line 662 may connect to a first set of NAND strings within the first portion of the memory array and connect to a second set of NAND strings within the second portion of the memory array. Similarly, the second bit line 664 may connect to a third set of NAND strings within the first portion of the memory array and connect to a fourth set of NAND strings within the second portion of the memory array. In one example, the first bit line 662 may connect to the drain-side ends of 64 vertical NAND strings within the first portion of the memory array and may connect to the drain-side ends of another 64 vertical NAND strings within the second portion of the memory array. In this case, the drain-side ends of the 128 vertical NAND strings may connect to a sense amplifier for sensing via the first bit line 662 during a memory operation (e.g., a read operation or a verify operation).

FIGS. 6E-6F depict another embodiment of a memory array and connections to circuitry located underneath the memory array. As depicted in FIG. 6E, a first set of sense amplifiers 671 may be arranged underneath a first portion of the memory array, a second set of sense amplifiers 672 may be arranged underneath a second portion of the memory array, and a third set of sense amplifiers 673 may be arranged underneath a third portion of the memory array. A first bit line 687 located on an upper metal routing layer above the memory array may connect to a first track 683 on a lower routing layer below the memory array that is connected to a third sense amplifier of the third set of sense amplifiers 673. A second bit line 686 located within the upper metal routing layer above the memory array may connect to a second track 676 on the lower routing layer below the memory array that is connected to a first sense amplifier of the first set of sense amplifiers 671.

In one embodiment, eight bit lines including bit line 686 and bit line 687 may extend across the first portion, the second portion, and the third portion of the memory array. Each of the eight bit lines may connect to the drain-side ends of NAND strings within the first portion, the second portion, and the third portion of the memory array. In one example, the bit line 686 may connect to the drain-side ends of a first grouping of vertical NAND strings within the first portion of the memory array, a second grouping of vertical NAND strings within the second portion of the memory array, and a third grouping of vertical NAND strings within the third portion of the memory array. The bit line 686 may connect to the second track 676 via a vertical connection positioned between the first portion of the memory array and the second portion of the memory array. In one example, a memory array break or a vertical routing channel may be used between the first portion of the memory array and the second portion of the memory array to connect the bit line 686 to the second track 676.

As depicted in FIG. 6E, routing tracks 676 and 677 may be used to connect two sense amplifiers within the first set of sense amplifiers 671 to two bit lines of the eight bit lines arranged above the memory array, routing tracks 678 and 679 may be used to connect two sense amplifiers within the second set of sense amplifiers 672 to two bit lines of the eight bit lines arranged above the memory array, routing tracks 680 and 681 may be used to connect two sense amplifiers within the second set of sense amplifiers 672 to two bit lines of the eight bit lines arranged above the memory array, and routing tracks 682 and 683 may be used to connect two sense amplifiers within the third set of sense amplifiers 673 to two bit lines of the eight bit lines arranged above the memory array. The vertical connections for the routing tracks 676-679 may be positioned between the first portion of the memory array and the second portion of the memory array. The vertical connections for the routing tracks 680-683 may be positioned between the second portion of the memory array and the third portion of the memory array.

Figure 7:
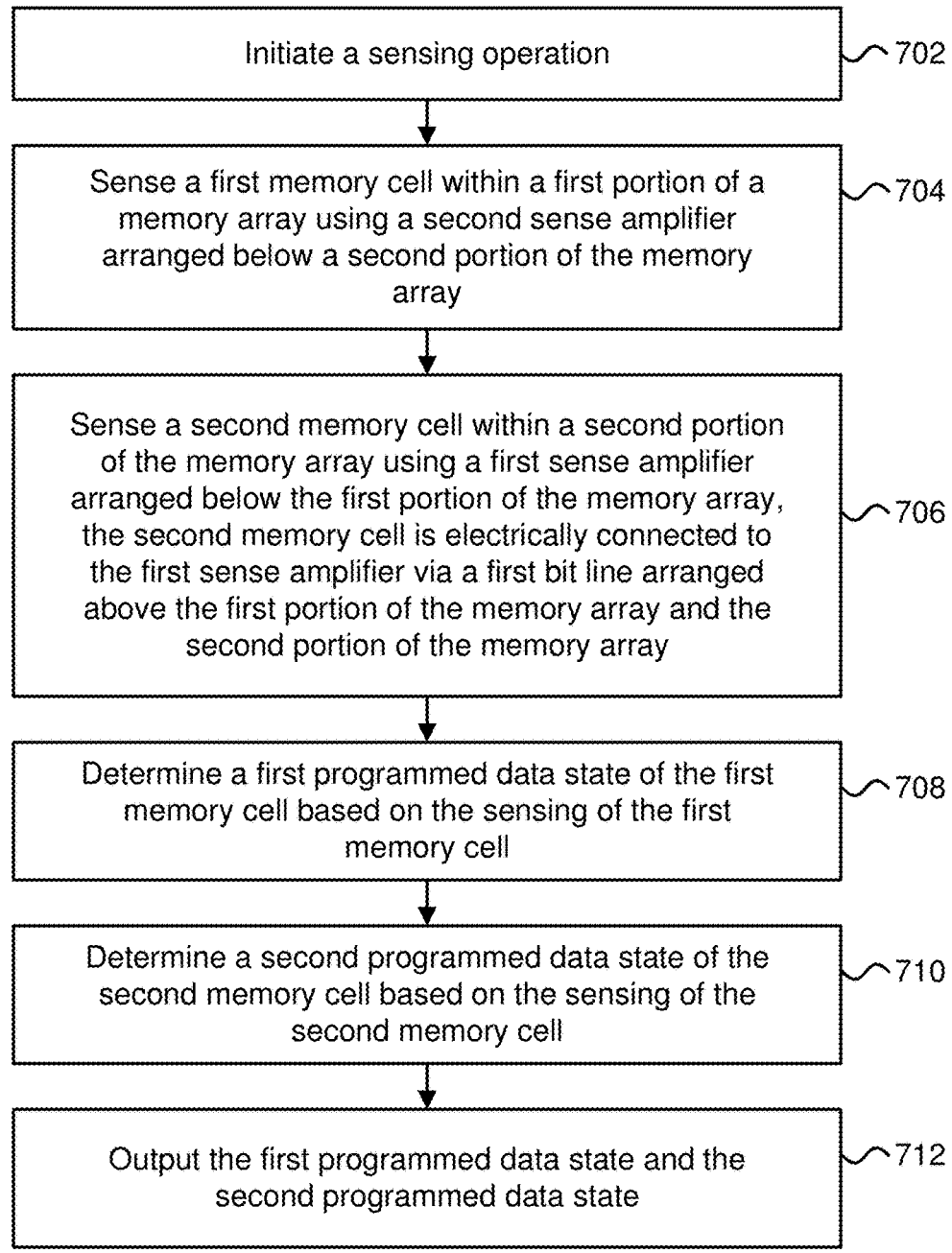
FIG. 7 is a flowchart describing one embodiment of a process for performing a sensing operation.

FIG. 7 is a flowchart describing one embodiment of a process for performing a sensing operation. In one embodiment, the process of FIG. 7 may be performed by sensing circuitry located under a memory array, such as the sense amplifiers depicted in FIGS. 6A-6F.

In step 702, a sensing operation is initiated. The sensing operation may comprise a read operation, a verify operation, a program verify operation, or an erase verify operation. In step 704, a first memory cell within a first portion of a memory array is sensed using a second sense amplifier arranged below a second portion of the memory array. In step 706, a second memory cell within a second portion of the memory array is sensed using a first sense amplifier arranged below the first portion of the memory array. The second memory cell may be electrically connected to the first sense amplifier via a first bit line arranged above the first portion of the memory array and the second portion of the memory array. In step 708, a first programmed data state of the first memory cell is determined based on the sensing of the first memory cell. In step 710, a second programmed data state of the second memory cell is determined based on the sensing of the second memory cell. In step 712, the first programmed data state and the second programmed data state are outputted. In one example, the first programmed data state and the second programmed data state may be outputted from sensing circuitry arranged below the memory array.

One embodiment of the disclosed technology includes a first sense amplifier arranged below a first portion of a memory array, a second sense amplifier arranged below a second portion of the memory array, a first bit line arranged above the first portion of the memory array and the second portion of the memory array, and a second bit line arranged above the first portion of the memory array and the second portion of the memory array. The second bit line connects to the second sense amplifier via a second vertical connection positioned between the first portion of the memory array and the second portion of the memory array. The first bit line connects to the first sense amplifier via a first vertical connection positioned between the first portion of the memory array and the second portion of the memory array.

One embodiment of the disclosed technology includes a first sensing circuit positioned below a first portion of a memory array and a second sensing circuit arranged below a second portion of the memory array. The first sensing circuit is connected to a first bit line positioned above the second portion of the memory array via a first vertical connection between the first portion of the memory array and the second portion of the memory array. The second sensing circuit is connected to a second bit line positioned above the first portion of the memory array via a second vertical connection between the first portion of the memory array and the second portion of the memory array. The first bit line connects to a second set of memory cells that are part of the second portion of the memory array. The second bit line connects to a first set of memory cells that are part of the first portion of the memory array.

One embodiment of the disclosed technology includes sensing a first NAND string using a first sensing circuit arranged underneath a first portion of a memory array and sensing a second NAND string using a second sensing circuit arranged underneath a second portion of the memory array. The first sensing circuit is connected to a first bit line arranged above the first portion and the second portion of the memory array via a first vertical connection between the first portion of the memory array and the second portion of the memory array. The second sensing circuit is connected to a second bit line arranged above the first portion and the second portion of the memory array via a second vertical connection between the first portion of the memory array and the second portion of the memory array. The first bit line connects to a drain-side end of the first NAND string and the second bit line connects to a drain-side end of the second NAND string.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a first sense amplifier arranged below a first portion of a memory array;
a second sense amplifier arranged below a second portion of the memory array;
a third sense amplifier arranged below a third portion of the memory array;
a first bit line arranged above the first portion of the memory array and the second portion of the memory array, the first bit line connects to the first sense amplifier via a first vertical connection positioned between the first portion of the memory array and the second portion of the memory array, the first bit line connects to a first set of memory cells within the first portion of the memory array and connects to a second set of memory cells within the second portion of the memory array, the first sense amplifier configured to sense one of the first set of memory cells during a sensing operation;
a second bit line arranged above the first portion and the second portion, the second bit line connects to the second sense amplifier via a second vertical connection positioned between the first portion of the memory array and the second portion of the memory array, the second bit line connects to a third set of memory cells within the first portion of the memory array and connects to a fourth set of memory cells within the second portion of the memory array, the second sense amplifier configured to sense one of the third set of memory cells during the sensing operation; and a third bit line arranged above the second portion of the memory array and the third portion of the memory array, the third bit line connects to the third sense amplifier via a third vertical connection positioned between the second portion of the memory array and the third portion of the memory array, the third bit line connects to a fifth set of memory cells within the first portion of the memory array and connects to a sixth set of memory cells within the third portion of the memory array, the third sense amplifier configured to sense one of the fifth set of memory cells during the sensing operation.

2. The apparatus of claim 1, wherein:
the sensing operation comprises a read operation.

3. The apparatus of claim 1, wherein:
the sensing operation comprises a verify operation.

4. The apparatus of claim 1, wherein:
the first bit line is arranged above the third portion of the memory array; and
the second bit line is arranged above the third portion of the memory array.

5. The apparatus of claim 1, wherein:
the third bit line is arranged above the first portion of the memory array.

6. The apparatus of claim 1, wherein:
the first portion of the memory array includes a plurality of 3D NAND strings.

7. The apparatus of claim 1, wherein:
the first set of memory cells corresponds with a first vertical NAND string.

8. The apparatus of claim 1, wherein:
the first set of memory cells corresponds with a set of floating gate transistors.

9. The apparatus of claim 1, wherein:
the first set of memory cells corresponds with a set of charge trap transistors.

10. The apparatus of claim 1, wherein:
the memory array is monolithically formed in one or more physical levels of memory cells having active areas disposed above a silicon substrate.

11. A system, comprising:
a first sensing circuit positioned below a first portion of a memory array;
a third sensing circuit positioned below a third portion of the memory array; and
a second sensing circuit positioned below a second portion of the memory array, the first sensing circuit is connected to a first bit line positioned above the first portion of the memory array and the second portion of the memory array via a first vertical connection between the first portion of the memory array and the second portion of the memory array, the first bit line connects to a first set of memory cells within the first portion of the memory array and connects to a second set of memory cells within the second portion of the memory array, the first sensing circuit configured to sense one of the first set of memory cells during a sensing operation, the second sensing circuit is connected to a second bit line positioned above the first portion of the memory array and the second portion of the memory array via a second vertical connection between the first portion of the memory array and the second portion of the memory array, the second bit line connects to a third set of memory cells within the first portion of the memory array and connects to a fourth set of memory cells within the second portion of the memory array, the second sensing circuit configured to sense one of the third set of memory cells during the sensing operation, a third bit line arranged above the second portion of the memory array and the third portion of the memory array, the third bit line connects to the third sensing circuit via a third vertical connection positioned between the second portion of the memory array and the third portion of the memory array, the third bit line connects to a fifth set of memory cells within the first portion of the memory array and connects to a sixth set of memory cells within the third portion of the memory array, the third sensing circuit configured to sense one of the fifth set of memory cells during the sensing operation.

12. The system of claim 11, wherein:
the sensing operation comprises a read operation.

13. The system of claim 12, wherein:
the first bit line is arranged above the third portion of the memory array; and
the second bit line is arranged above the third portion of the memory array.

14. The system of claim 11, wherein:
the first sensing circuit comprises a sense amplifier configured to determine a programmed data state of one of the second set of memory cells during a memory operation.

15. The system of claim 11, wherein:
the second sensing circuit is connected to the second bit line via a bit line decoder.

16. The system of claim 11, wherein:
the first portion of the memory array includes a first plurality of 3D NAND strings.

17. The system of claim 11, wherein:
the first set of memory cells corresponds with a set of floating gate transistors.

18. The system of claim 11, wherein:
the memory array is monolithically formed in one or more physical levels of memory cells having active areas disposed above a silicon substrate.

19. An apparatus, comprising:
a first sensing circuit arranged below a first portion of a three-dimensional NAND memory array, the first sensing circuit is connected to a first bit line driver, the first bit line driver electrically connects a first bit line arranged above the first portion of the three-dimensional NAND memory array and a second portion of the three-dimensional NAND memory array to the first sensing circuit;
a third sensing circuit arranged below a third portion of the three-dimensional NAND memory array, the third sensing circuit is connected to a third bit line driver, the third bit line driver electrically connects a third bit line arranged above the second portion of the three-dimensional NAND memory array and the third portion of the three-dimensional NAND memory array; and
a second sensing circuit arranged below the second portion of the three-dimensional NAND memory array, the second sensing circuit is connected to a second bit line driver, the second bit line driver electrically connects a second bit line arranged above the first portion of the three-dimensional NAND memory array and the second portion of the three-dimensional NAND memory array to the second sensing circuit, the first bit line connects to a first set of memory cells within the first portion of the memory array and connects to a second set of memory cells within the second portion of the memory array, the first sensing circuit configured to sense one of the first set of memory cells during a sensing operation, the second bit line connects to a third set of memory cells within the first portion of the memory array and connects to a fourth set of memory cells within the second portion of the memory array, the second sensing circuit configured to sense one of the third set of memory cells during the sensing operation, the third bit line connects to a fifth set of memory cells within the first portion of the memory array and connects to a sixth set of memory cells within the third portion of the memory array, the third sensing circuit configured to sense one of the fifth set of memory cells during the sensing operation.

20. The apparatus of claim 19, wherein:
the first bit line driver electrically connects to the first bit line via a first vertical connection arranged between the first portion of the three-dimensional NAND memory array and the second portion of the three-dimensional NAND memory array;
the second bit line driver electrically connects to the second bit line via a second vertical connection arranged between the first portion of the three-dimensional NAND memory array and the second portion of the three-dimensional NAND memory array; and
the sensing operation comprises a read operation.

21. The apparatus of claim 19, wherein:
the first bit line driver is arranged below the first portion of the three-dimensional NAND memory array; and
the second bit line driver is arranged below the second portion of the three-dimensional NAND memory array.

22. An apparatus, comprising:
a first sensing circuit arranged underneath a first portion of a memory array;
a second sensing circuit arranged underneath a second portion of the memory array;
a third sensing circuit arranged underneath a third portion of the memory array;
a first bit line arranged above the first portion of the memory array and the second portion of the memory array, the first bit line connects to a first set of memory cells within the first portion of the memory array and connects to a second set of memory cells within the second portion of the memory array, the first sensing circuit configured to sense one of the first set of memory cells during a sensing operation;
means for connecting the first sensing circuit to the first bit line;
a second bit line arranged above the first portion of the memory array and the second portion of the memory array, the second bit line connects to a third set of memory cells within the first portion of the memory array and connects to a fourth set of memory cells within the second portion of the memory array, the second sensing circuit configured to sense one of the third set of memory cells during the sensing operation;
means for connection the second sensing circuit to the second bit line; and
a third bit line arranged above the second portion of the memory array and the third portion of the memory array, the third bit line connects to the third sensing circuit via a third vertical connection positioned between the second portion of the memory array and the third portion of the memory array, the third bit line connects to a fifth set of memory cells within the first portion of the memory array and connects to a sixth set of memory cells within the third portion of the memory array, the third sensing circuit configured to sense one of the fifth set of memory cells during the sensing operation.

23. The apparatus of claim 22, wherein:
the sensing operation comprises a read operation;
the means for connecting the first sensing circuit to the first bit line includes a first vertical connection positioned between the first portion of the memory array and the second portion of the memory array; and
the means for connecting the second sensing circuit to the second bit line includes a second vertical connection positioned between the first portion of the memory array and the second portion of the memory array.

* * * * *